United States Patent
Morrison et al.

(10) Patent No.: US 11,395,408 B2
(45) Date of Patent: Jul. 19, 2022

(54) WAFER-LEVEL PASSIVE ARRAY PACKAGING

(71) Applicant: Apple Inc., Cupertino, CA (US)

(72) Inventors: Scott D. Morrison, Austin, TX (US); Karthik Shanmugam, Singapore (SG); Raymundo M. Camenforte, San Jose, CA (US); Rakshit Agrawal, Milpitas, CA (US); Flynn P. Carson, Redwood City, CA (US); Kiranjit Dhaliwal, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/005,607

(22) Filed: Aug. 28, 2020

(65) Prior Publication Data

US 2022/0071013 A1 Mar. 3, 2022

(51) Int. Cl.
*H05K 1/18* (2006.01)
*H01L 23/00* (2006.01)

(52) U.S. Cl.
CPC ............. *H05K 1/181* (2013.01); *H01L 24/05* (2013.01); *H01L 24/08* (2013.01); *H01L 24/16* (2013.01); *H01L 24/94* (2013.01); *H01L 2224/0401* (2013.01); *H01L 2224/08235* (2013.01); *H01L 2224/08265* (2013.01); *H01L 2224/16227* (2013.01); *H01L 2224/16265* (2013.01); *H01L 2224/17164* (2013.01); *H05K 2201/1003* (2013.01); *H05K 2201/10015* (2013.01); *H05K 2201/10022* (2013.01); *H05K 2201/1053* (2013.01); *H05K 2201/10378* (2013.01); *H05K 2201/10515* (2013.01); *H05K 2201/10522* (2013.01)

(58) Field of Classification Search
CPC ......... H05K 1/181; H05K 2201/10522; H05K 2201/10015; H05K 2201/1003; H05K 2201/10022; H05K 2201/1053; H05K 2201/10515; H05K 2201/10378; H01L 24/08; H01L 24/16; H01L 24/94; H01L 24/05; H01L 2224/16227; H01L 2224/08235; H01L 2224/16265; H01L 2224/17164; H01L 2224/08265; H01L 2224/0401
USPC ........................ 361/760–767, 770–790, 795; 174/258–264; 257/660–730
See application file for complete search history.

(56) References Cited

U.S. PATENT DOCUMENTS

| | | | | |
|---|---|---|---|---|
| 6,841,842 B2* | 1/2005 | Li | ............................ | H01L 31/12 257/431 |
| 7,005,747 B2* | 2/2006 | Koizumi | ................ | H01L 23/642 257/E21.503 |
| 7,091,586 B2* | 8/2006 | Millik | ................... | H05K 1/0262 257/E23.101 |
| 7,317,622 B2* | 1/2008 | Li | ......................... | H05K 1/0231 361/306.3 |
| 7,875,973 B2* | 1/2011 | Chiu | ...................... | H05K 1/184 257/737 |

(Continued)

*Primary Examiner* — Tuan T Dinh
(74) *Attorney, Agent, or Firm* — Aikin & Gallant, LLP

(57) ABSTRACT

Wafer level passive array packages and modules are described. In an embodiment, a module includes a circuit board, and a package mounted on the circuit board in which the package includes a plurality of passive components bonded to a bottom side of the die and a plurality of landing pads of the circuit board.

13 Claims, 12 Drawing Sheets

(56) References Cited

U.S. PATENT DOCUMENTS

| | | | |
|---|---|---|---|
| 8,188,594 B2* | 5/2012 | Ganesan | H01L 23/49827 |
| | | | 257/E23.101 |
| 8,597,979 B1* | 12/2013 | Burgyan | H01L 21/561 |
| | | | 438/106 |
| 9,553,061 B1* | 1/2017 | Letourneau | H01L 24/03 |
| 9,633,977 B1* | 4/2017 | We | H01L 23/5387 |
| 10,068,862 B2 | 9/2018 | Do et al. | |
| 10,418,317 B2 | 9/2019 | Lee et al. | |
| 10,629,507 B1 | 4/2020 | Li et al. | |
| 2009/0267220 A1* | 10/2009 | Kuhlman | H05K 1/181 |
| | | | 438/118 |
| 2011/0068459 A1* | 3/2011 | Pagaila | H01L 24/97 |
| | | | 257/698 |
| 2014/0252544 A1* | 9/2014 | Li | H01L 23/50 |
| | | | 257/532 |
| 2015/0294791 A1* | 10/2015 | Hwang | H01G 4/1227 |
| | | | 174/260 |
| 2016/0084887 A1* | 3/2016 | Beer | G01R 19/0092 |
| | | | 324/126 |
| 2016/0176701 A1* | 6/2016 | Gupta | B81B 7/008 |
| | | | 257/254 |
| 2017/0064837 A1* | 3/2017 | Li | H05K 1/113 |
| 2018/0145033 A1* | 5/2018 | Yl | H01L 21/486 |
| 2019/0013301 A1* | 1/2019 | Cheah | H01L 23/49838 |
| 2019/0198445 A1* | 6/2019 | Alur | H01L 25/18 |
| 2020/0020653 A1 | 1/2020 | Lim et al. | |
| 2020/0075521 A1* | 3/2020 | Elsherbini | H01L 23/481 |
| 2020/0357737 A1* | 11/2020 | Arvin | H01L 24/09 |

\* cited by examiner

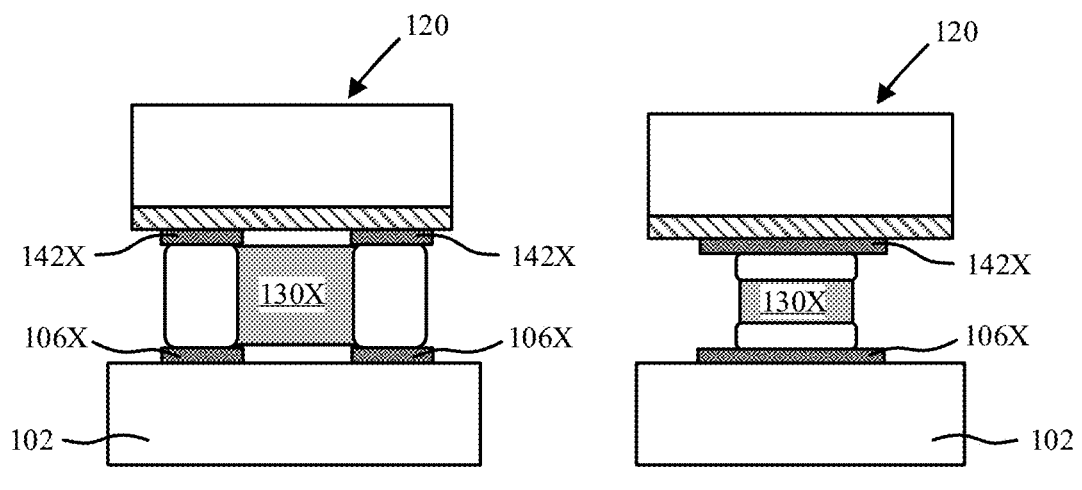
*FIG. 2G*   *FIG. 2H*

WAFER-LEVEL PASSIVE ARRAY PACKAGING

BACKGROUND

Field

Embodiments described herein relate to microelectronic packaging, and more particularly wafer-level passive array (WLPA) packaging techniques.

Background Information

The current market demand for portable and mobile electronic devices such as mobile phones, personal digital assistants (PDAs), digital cameras, portable players, gaming, and other mobile devices requires the integration of more performance and features into increasingly smaller spaces. A traditional microelectronic module may include one or more semiconductor packages and other components mounted onto a circuit board. Packaging solutions such as wafer level chip scale package (WLCSP) technology can allow the semiconductor packages to be no larger than the dice (chips) themselves, further allowing a reduction of footprint. In a traditional module, packages are mounted on a circuit board adjacent to a plurality of passive components that can provide supplemental features such as filtering applications, power supplies, etc.

SUMMARY

Embodiments describe wafer-level passive array (WLPA) packaging techniques, semiconductor packages and modules thereof. In an embodiment, a module includes a circuit board including a top side including a first plurality of landing pads, and a package mounted on the circuit board and bonded to the first plurality of landing pads. The package may be a WLPA package including a die and a plurality of passive components bonded to both a bottom side of the die and the first plurality of landing pads of the circuit board. Specifically, the plurality of passive components can be bonded to a redistribution layer (RDL) of the die or a fanout RDL on the die. In a particular embodiment, the plurality of passive components is directly underneath the die, within a shadow of the die.

In some embodiments, the plurality of passive components is bonded to the die with a first solder material and bonded to the circuit board with a second solder material. The first solder material may be characterized by a higher reflow temperature than the second solder material. For example, this can facilitate the package mounting process and reduce tilting of the passive components. The passive components can have a variety of functions, and functionality can additionally be at least partly determined by connectivity to the die and circuit board using a variety of active, and dummy pads, etc. In some embodiments all passive components may be the same height, while in other embodiments passive components of different heights are accommodated. Exemplary modules may include cavities within the circuit board to accommodate taller passive components. In other embodiments, the plurality of components can be assembled separately as an interposer-type package level.

BRIEF DESCRIPTION OF THE DRAWINGS

FIGS. 2G-2H are schematic cross-sectional side view illustrations of dummy connections without circuit paths in accordance with embodiments.

DETAILED DESCRIPTION

Figure 1:
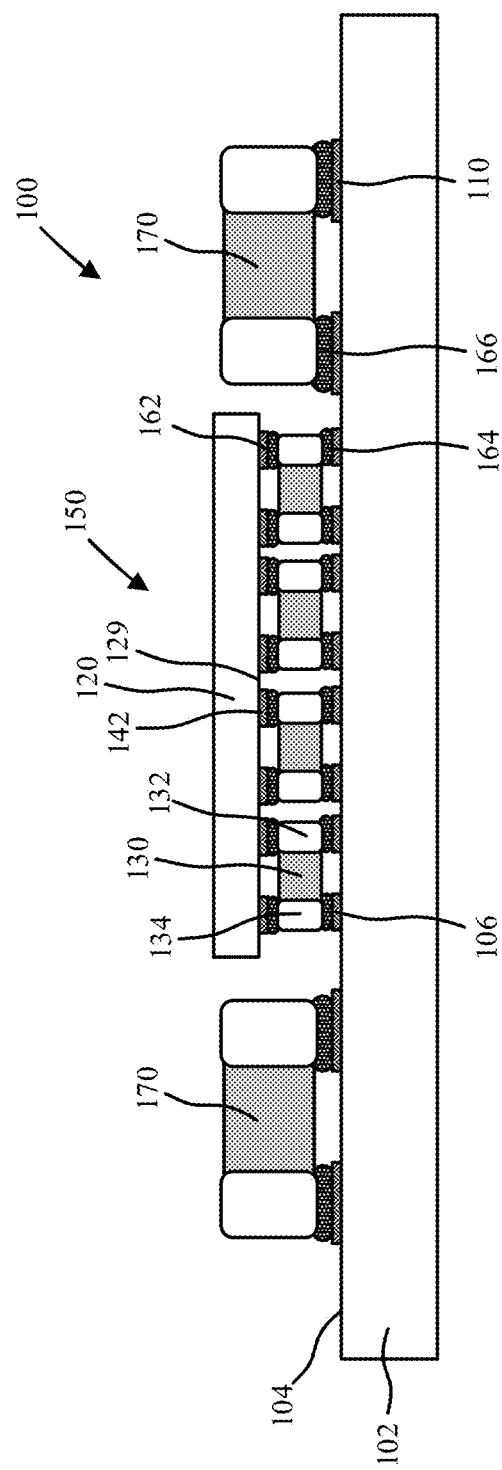
FIG. 1 is a schematic cross-sectional side view illustration of a module including a WLPA package in accordance with an embodiment.

Embodiments describe wafer-level passive array (WLPA) packaging techniques, semiconductor packages and modules thereof. In an embodiment, a module includes a circuit board including a top side including a first plurality of landing pads, and a package mounted on the circuit board and bonded to the first plurality of landing pads. In accordance with embodiments, the package includes a die and a plurality of passive components (e.g. capacitors, resistors, inductors, combinations thereof, etc.) bonded to both a bottom side of the die and the first plurality of landing pads of the circuit board. Specifically, the plurality of passive components can be bonded to a redistribution layer (RDL) of the die or a fanout RDL on the die. While the following embodiments are described in particular with regard to a plurality of passive components, embodiments may also be applicable to sets of one or more passive components. In an embodiment, a package includes a die and a set of one or more passive components (e.g. capacitors, resistors, inductors, combinations thereof, etc.), with each passive component bonded to both a bottom side of the die and a first set of one or more landing pads of the circuit board. The one or more passive components in accordance with embodiments may be directly underneath the die, and a portion of which may optionally extend beyond a perimeter of the die.

In one aspect, the WLPA packaging techniques and packages in accordance with embodiments can reduce area of a module by vertically integrating the passive components underneath a die within the package. Furthermore, such WLPA packaging techniques and packages in accordance with embodiments can more densely occupy available vertical space of modules, particularly when the packages are mounted on a circuit board adjacent to tall components. Thus, the WLPA packages reduce module area and increase vertical packing density of the module.

In another aspect, the WLPA packaging techniques in accordance with embodiments are a deviation from WLCSP technology. Similar to WLSCP, a plurality of die areas may be fabricated at the wafer scale, and a back-end-of-the line (BEOL) build-up structure is at least partially formed over the wafer (e.g. silicon) including the plurality of die areas. Rather than completing the BEOL build-up structure, forming a plurality of under bump metallurgy (UBM) pads, and addition of solder bumps, the WLPA packaging techniques in accordance with embodiments may test the partially fabricated BEOL build-up structure, form a redistribution layer (RDL) over the BEOL build-up structure to accommodate pad layout for the plurality of passive components, apply solder material (e.g. bumps, paste) to either the UBM pads or passive components, and attach the plurality of passive components to the RDL, followed by singulation. Solder bumps can then be applied to a circuit board, followed by mounting of the packages onto the circuit board. In this manner, electrical routing between the package die and the circuit board runs through the plurality of passive components, which can also include "dummy" passive components, to complete electrical connectivity.

Routing through the plurality of passive components in accordance with embodiments can provide additional functionality, such as enclosing a current loop between the die and a passive component such as a bypass capacitor for performance. This can also allow for reduction of circuit board routing length for sensitive analog signals, and prevent such signals from overlapping other circuit board routing. Furthermore, such a configuration can increase available "on-die" decoupling capacitance or radio frequency (RF) capacitance. For example, this may be facilitated both by location, and providing ceramic dielectrics which would generally be unavailable for capacitors formed within the die.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", "spanning" and "on" as used herein may refer to a relative position of one layer with respect to other layers. One layer "over", "spanning" or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1 a cross-sectional side view illustration is provided of a module 100 including a WLPA package 150 in accordance with an embodiment. As shown, the module 100 includes a circuit board 102 including a top side 104 including a plurality of landing pads 106. A package 150 is mounted on the circuit board 102 and bonded the plurality of landing pads 106. The package 150 may include a die 120 and one or more of passive components 130 bonded to both a bottom side 129 of the die 120 and the plurality of landing pads 106 of the circuit board 102. The one or more passive components 130 may be directly underneath the die 120, within a shadow of the die 120. In some embodiments, a portion of the one or more passive components can extend (e.g. laterally) beyond a perimeter of the die 120. In an embodiment, the bottom side 129 of the die 120 includes a plurality of contact pads 142 to which the passive component(s) 130 are bonded. Each passive component 130 in accordance with embodiments may be bonded to a respective landing pad 106 of the circuit board 102, or more than one landing pad 106 of the circuit board. Bonding may include physical attachment, electrical connectivity and/or communicative coupling.

In a particular configuration, the one or more passive components 130 is bonded to the die 120 with first solder joints 162 and bonded to the circuit board 102 with second solder joints 164. The first solder material of first solder joints 162 may be characterized by a higher reflow temperature than the second solder material of second solder joints 164 in order to facilitate maintaining alignment (e.g. prevent tilting) of the passive components 130 when mounting the package 150 on the circuit board 102.

One or more additional components 170 or dies may also be bonded to a second plurality of landing pads 110 on the top side 104 of the circuit board 102, for example with solder joints 166. The additional components 170 may be taller than the passive components 130. As shown, locating the passive components 130 underneath the die 120 can save module area, while increasing vertical packing density, particularly when the additional component(s) 170 are taller than the die 120. In some embodiments the passive components 130 all have the same height, and optionally same size. In other embodiments, groups of passive components 130 of different sizes can be included.

The passive components 130 in accordance with embodiments can have a variety of configurations that can provide electrical connection between the die 120 and circuit board 102. Furthermore, routing to contact pads 142 and landing pads 106 can partially determine functionality of the passive components 130. For example, dummy contact pads, or dummy landing pads and corresponding routing can be included to determine connectivity and function of the passive components 130. Furthermore, dummy passive components can be included, where no electrical connection is made between terminals 132, 134.

Referring now to FIGS. 2A-2H a variety of schematic cross-sectional side view illustrations are provided for electrical connection and circuit paths for a variety of passive component configurations in accordance with embodiments. The various circuit paths can include shunt paths, series paths, die only paths, circuit board only paths, series paths, multi-circuit paths, etc. It is to be appreciated the particular examples provided in FIGS. 2A-2H are illustrative, and embodiments are not so limited. Furthermore, modules 100 in accordance with embodiments may include a combination of various electrical connections, such as those illustrated and described with regard to FIGS. 2A-2H. In some embodiments, a passive component may be oriented laterally with respect to the die and circuit board to facilitate coupling of multiple terminals (e.g. a first and second terminal) on both a top side and bottom side of the passive component. Alternatively, a passive component may be oriented vertically to facilitate coupling of respective terminals to either a top side or bottom side of the passive component.

Figure 2A:
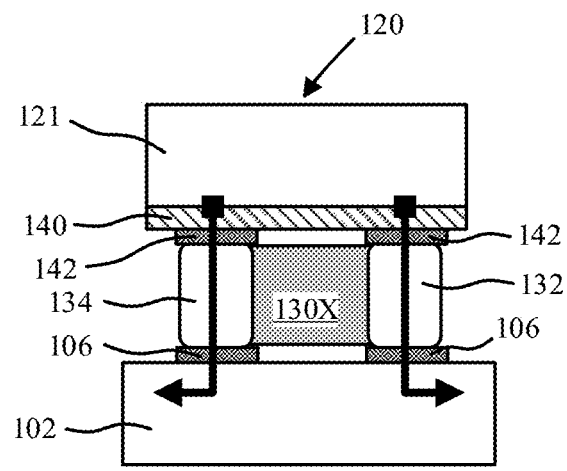
FIG. 2A is a schematic cross-sectional side view illustration of a shunt path through a passive component in accordance with an embodiment.

FIG. 2A is a schematic cross-sectional side view illustration of a shunt path through a passive component in accordance with an embodiment. As shown, a shunt path (or low resistance connection) can flow directly between the contact pads 142 and landing pads 106 through one or more terminals 132, 134 of a passive component. In particular, the passive component may be a dummy passive component 130X without an electrical connection between terminals 132, 134 or a high resistance connection therebetween, however this is not required for a shut path. In accordance with embodiments, one or both of the terminals 132, 134 can be electrically connected as a shunt path within a circuit connecting the die 120 and circuit board 102.

Figure 2B:
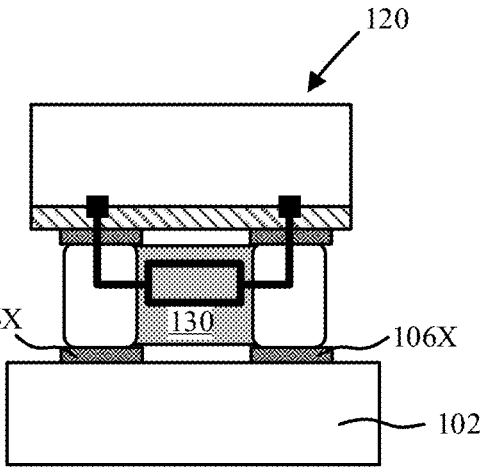
FIG. 2B is a schematic cross-sectional side view illustration of a die only path through a passive component in accordance with an embodiment.

FIG. 2B is a schematic cross-sectional side view illustration of a die only path through a passive component in accordance with an embodiment. For clarity, functionality of the passive component within the overlaid circuit path is illustrated as a generic box. In such a configuration, the passive component 130 is only electrically connected to a circuit within the die 120 and can be bonded to dummy landing pads 106X on the circuit board 102. For example, the dummy landing pads 106X may not be electrically connected to routing within the circuit board 102. In an embodiment, the passive component 130 is connected only to a die circuit only as a passive component, such as capacitor, inductor, resistor, etc.

Figure 2C:
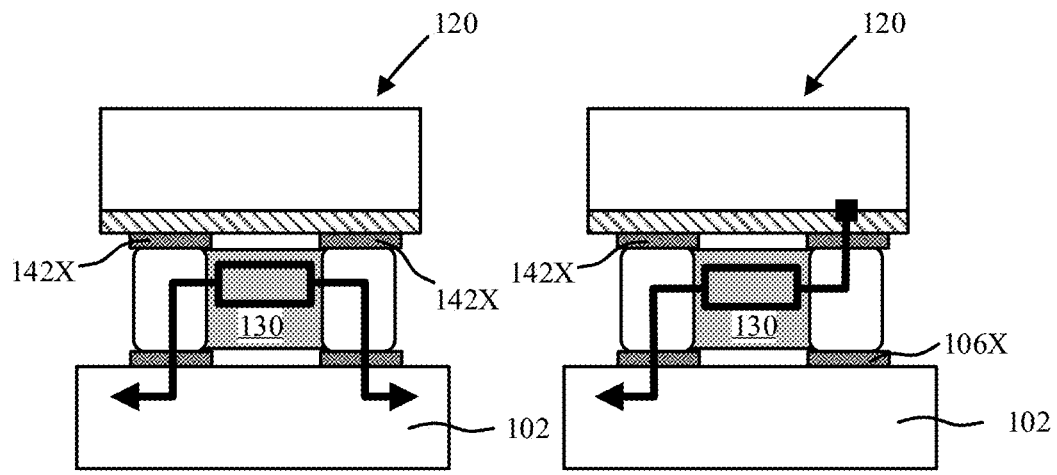
FIG. 2C is a schematic cross-sectional side view illustration of a circuit board only path through a passive component in accordance with an embodiment.

Similar to FIG. 2B, FIG. 2C is a schematic cross-sectional side view illustration of a circuit board only path through a passive component in accordance with an embodiment. In such a configuration, the passive component 130 is only connected to a circuit within the circuit board 102, and can be bonded to dummy contact pads 142X. For example, the dummy contact pads 142X may not be electrically connected to routing within the redistribution layer 140 (described in more detail with regard to FIGS. 4-6). In an embodiment, the passive component 130 is connected a circuit board circuit only as a passive component, such as capacitor, inductor, resistor, etc.

Figure 2D:
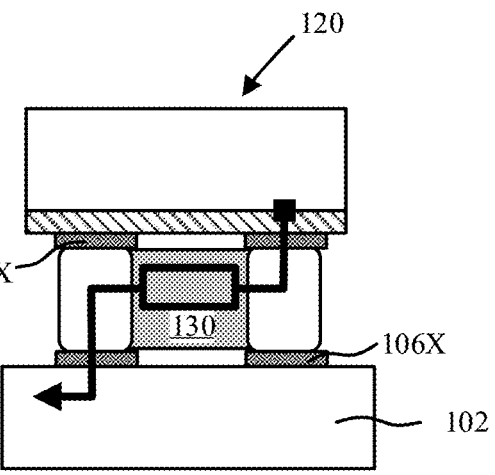
FIG. 2D is a schematic cross-sectional side view illustration of a series path through a passive component in accordance with an embodiment.

Referring now to FIG. 2D, a schematic cross-sectional side view illustration is provided of a series path through a passive component 130 in accordance with an embodiment. As shown, the series path may proceed through one of the terminals 132, 134 connected to the die 120, through the passive component 130, and to the other terminal 132, 134 connected to the circuit board 102. In the illustrated embodiment, terminal 132 electrically connected to the die 120 is bonded to contact pad 142 and dummy landing pad 106X, while terminal 134 electrically connected to the circuit board 102 is bonded to landing pad 106 and dummy contact pad 142X. In an embodiment, the passive component 130 is connected a circuit between the die 120 and circuit board 102 as passive component, such as capacitor, inductor, resistor, etc.

Figure 2E:
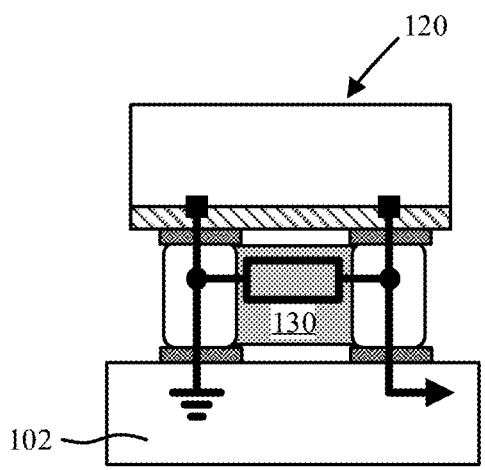
FIG. 2E is a schematic cross-sectional side view illustration of a multi-circuit path through a passive component in accordance with an embodiment.

FIG. 2E is a schematic cross-sectional side view illustration of a multi-circuit path through a passive component in accordance with an embodiment. As shown, the passive component 130 is connected to circuits in both the die 120 and circuit board 102. For example, the passive component may be coupled to both the die 120 and circuit board 102 as a passive component, such as capacitor, inductor, resistor, etc.

Figure 2F:
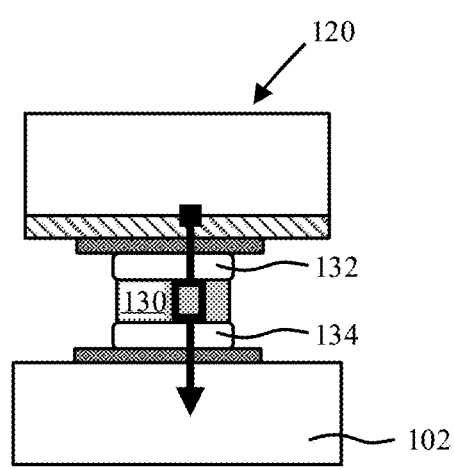
FIG. 2F is a schematic cross-sectional side view illustration of a series path through a passive component in accordance with an embodiment.

Up until this pint, passive component 130 layouts have been described and illustrated in which the multiple terminals 132, 134, etc. are bonded to both the die 120 and circuit board 102. However, embodiments are not so limited, and vertical passive components 130 can also be included in which the terminals 132, 134 are connected only to the die 120 or circuit board 102 as illustrated in FIG. 2F.

Furthermore, the dummy passive components 130X can also be included, where the terminals 132, 134 are bonded to only dummy landing pads 106X and dummy contact pads 142 as illustrated in FIGS. 2G-2H. Such dummy passive components 130X and connections may be useful for mechanical purposes and stress balancing of the package 150.

Figure 3:
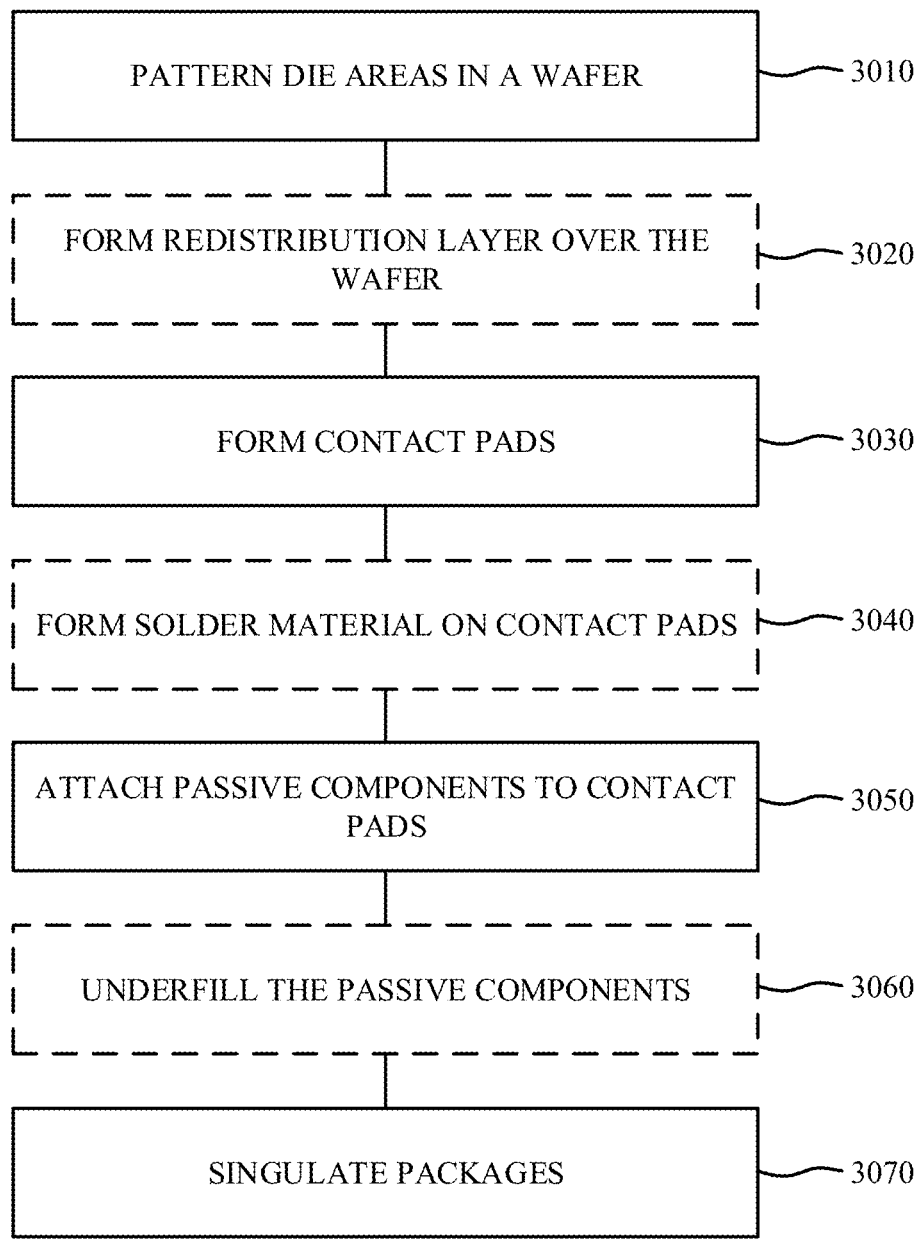
FIG. 3 is a process flow for a method of fabricating a WLPA package in accordance with an embodiment.
Figure 4:
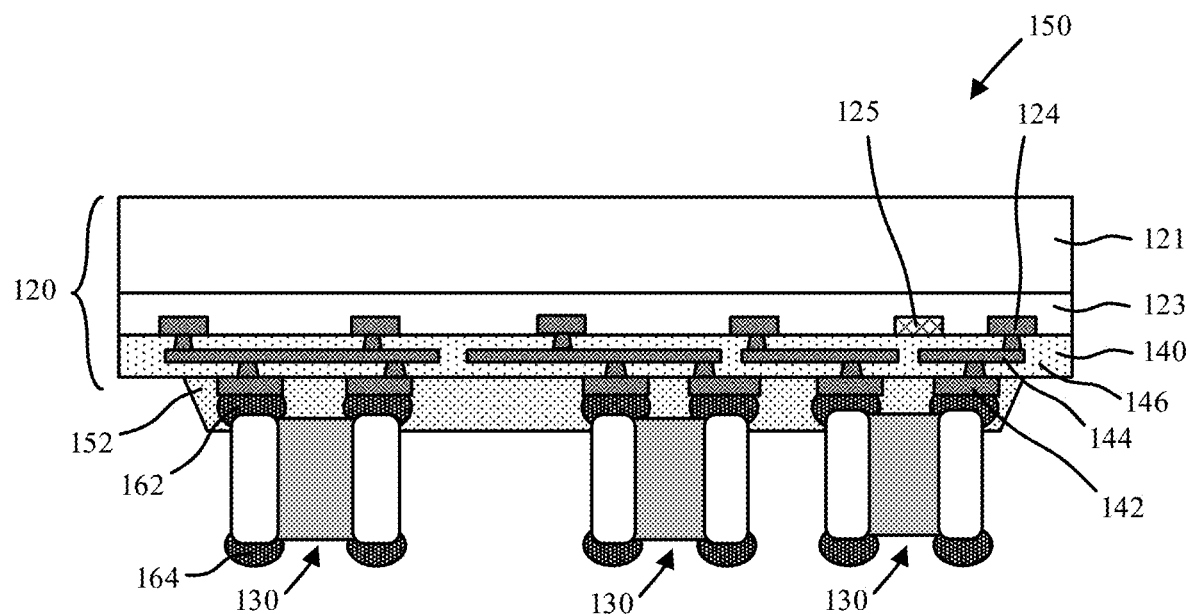
FIG. 4 is a schematic cross-sectional side view illustration of a WLPA package with an integrated RDL in accordance with an embodiment.

Referring now to FIG. 3 a process flow is provided for a method of fabricating a WLPA package 150 in accordance with an embodiment. FIG. 4 is a schematic cross-sectional side view illustration of a WLPA package 150 with an integrated RDL 140 in accordance with an embodiment. In interest of clarity and conciseness, the description of the process flow of FIG. 3 is made with regard to the WLPA package 150 of FIG. 4.

At operation 3010 a plurality of die areas is patterned in a wafer, such as silicon wafer. Each die area may include a traditional bulk layer 121 (e.g. crystalline silicon) into which devices such as transistors, etc. are formed and a back-end-of-the-line (BEOL) build-up structure 123 which typically includes metallization layers and dielectric layers. For example, build-up structure 123 may be formed using a damascene or dual damascene process to form interconnect layers and vias (e.g. copper, aluminum). For example, such damascene or dual damascene processes may include planarized metallization layers and vias. Dielectric layers, also referred to as interlayer dielectrics, can also be planarized. Suitable materials include oxides (e.g. $SiO_2$), nitrides, low-K dielectrics such as fluorine doped silicon oxide, carbon doped silicon oxide, porous oxides, and spin on dielectrics. The build-up structure 123 may terminate with BEOL pads 124 and test pads 125. For example, both of which may be copper pads, aluminum pads, etc. Test pads 125 may be designed for automatic test equipment (ATE) probing to verify die area functionality. It is to be appreciated that this processing sequence may stop prematurely compared to conventional BEOL processing which continues all the way to formation of under bump metallurgy (UBM) pads for die mounting. Alternatively, the BEOL build-up structure 123 processing sequence can proceed all the way to formation of UBM pads as contact pads 142.

As shown in FIG. 4, at operation 3020 a redistribution layer (RDL) is optionally formed on the partially fabricated and tested BEOL build-up structure 123. The RDL 140 can include routing layers 144 and dielectric layers 146 similar to the BEOL build-up structure 123. In some embodiments RDL 140 is formed using the same processing technologies as the BEOL build-up structure 123, such as damascene or dual damascene and use the same materials as dielectric layers 146. In such a process the RDL 140 may be indistinguishable from the BEOL build-up structure 123. The routing layers 144 may be formed on and electrically connected to the BEOL pads 124, though may cover and insulate the test pads 125, which can remain electrically open. The RDL 140 may alternatively be formed using different processing technologies as the BEOL build-up structure 123. For example, the RDL 140 may be formed using thin film techniques, and dielectric layers may be formed of different materials than those of the BEOL build-up structure 123. In such a process the RDL 140 may be physically distinguishable from the BEOL build-up structure 123 in shape, and composition of the layers. For example, thin film routing layers may include deposited and patterned metal layers without planarization/polishing. Furthermore, a thickness of the metal layer contour may be conformal to the underlying topology. As an example, a thin film metal routing layer may line a via opening (as opposed to a damascene metal which fills the via), however this is not required in all thin film processes. Where the optional RDL is formed, the sequence can include formation of contact pads 142, such as UBM contact pads at operation 3030.

The optional RDL 140 in accordance with embodiments may be formed for adjustment of the contact pad 142 location in order to accommodate mounting of the plurality of passive components 130. In this manner, the die wafer can be primarily an off-the-shelf intermediate product where final routing and contact pad 142 location can be adjusted based on passive component 130 size, while underlying device and circuit design of the die is unchanged.

At operation 3040 solder material for solder joints 162 can optionally be formed on the RDL 140 contact pads 142 using a suitable technique such as plating, printing, dropping, etc. followed by attaching the plurality of passive components 130 to the contact pads 142 at operation 3050. Alternatively, the solder material for solder joints 162 can be provided with the passive components 130. Each passive component 130 in accordance with embodiments may be bonded to a respective contact pad 142 of the RDL 140, or more than one contact pad 142 of the RDL 140. Bonding may include physical attachment, electrical connectivity and/or communicative coupling.

An underfill material 152, such as epoxy, etc., may then optionally be applied between the die 120 and components 130, and laterally surrounding the solder joints 162 at operation 3060, followed by singulation of individual packages 150 at operation 3070. Solder material for solder joints 164 may optionally be applied to the exposed terminals 132, 134 prior to singulation, or can be applied after singulation. Solder material for solder joints 164 can alternatively, or in addition, be applied to the circuit board (e.g. as paste) for mounting the packages 150. Solder material for solder joints 164 may be characterized by a lower reflow temperature than the solder material of solder joints 162. In this manner, solder joints 162 are not reflowed again when mounting the packages onto the circuit board 102.

Figure 5:
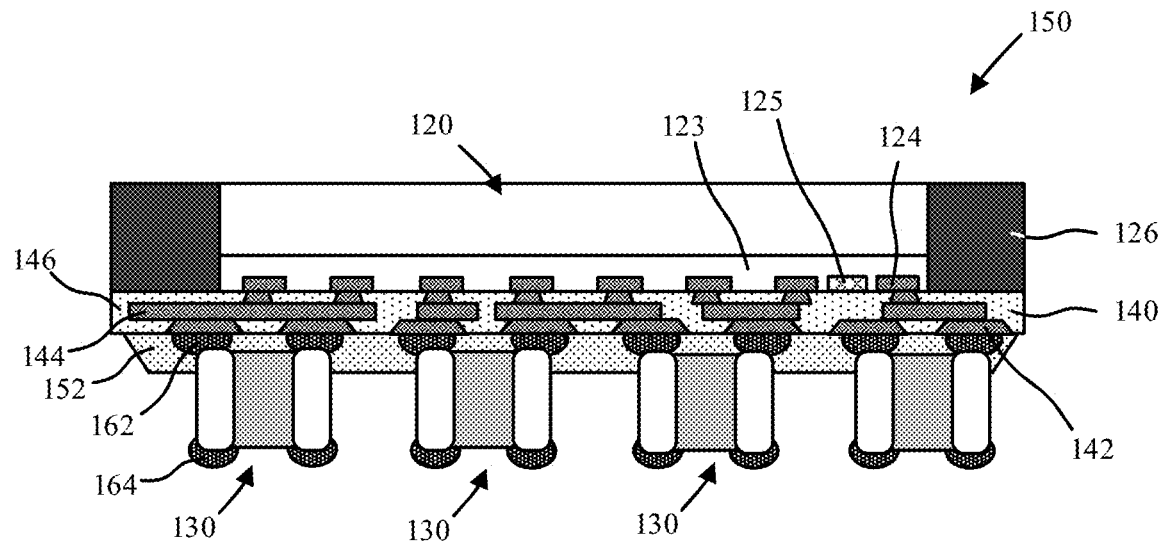
FIG. 5 is a schematic cross-sectional side view illustration of a WLPA package with a fanout RDL in accordance with an embodiment.

Referring now to FIG. 5, a schematic cross-sectional side view illustration is provided of a WLPA package 150 with a fanout RDL 140 in accordance with an embodiment. The package 150 of FIG. 5 may be fabricated similarly as that of the package 150 of FIG. 4, with the modification of forming the RDL 140 over a reconstituted wafer. In such a process flow, dies 120 are fabricated, singulated, and transferred to a temporary carrier, followed by encapsulation in a molding compound layer 126. The active side of the dies 120 include BEOL pads 124 and test pads 125 is then exposed, and a fanout RDL 140 can then be formed over the BEOL buildup structure 123 of the dies 120 and molding compound layer 126. The remainder of the fabrication sequence can then be similar to that described with regard to formation of the package 150 of FIG. 4. In such an embodiment, inclusion of a fanout RDL 140 can increase package area available for mounting the passive components 130 such that the number of passive components 130 is not limited by die 120 size, as is the case for the package 150 of FIG. 4. Each passive component 130 in accordance with embodiments may be bonded to a respective contact pad 142 of the RDL 140, or more than one contact pad 142 of the RDL 140. Bonding may include physical attachment, electrical connectivity and/or communicative coupling. The one or more passive components 130 in accordance with embodiments may be directly underneath the die 120, and a portion of which may optionally extend beyond a perimeter of the die 120, which can be facilitated by the fanout RDL 140.

Figure 6:
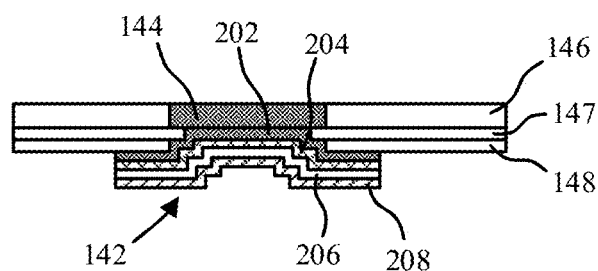
FIG. 6 is a schematic cross-sectional side view illustration for an RDL multi-layer UBM pad in accordance with an embodiment.

The contact pads 142 in accordance with embodiments described herein can be multi-layer UBM pads, distinguishable from single layer BEOL pads 124 and test pads 125. FIG. 6 is a schematic cross-sectional side view illustration for an RDL multi-layer UBM pad in accordance with an embodiment. Such contact pads 142 may include any combination of layers, such as an adhesion layer 202 (e.g. Cr, Ti, Ni, W, TiW) over an RDL routing layer 144, barrier layer 204 (e.g. Cr, W, Ti, TiW, Ni, Cr), wetting layer 206 (e.g. Cu, Ni, Pd, Pt), and anti-oxidation barrier layer 208 (e.g. Au). Additional dielectric layers may also be included at the exterior surface of the RDL 140, such as a first passivation layer 147 (e.g. oxide, oxy-nitride, nitride), and second passivation layer 148 (e.g. polyimide).

Figure 7:
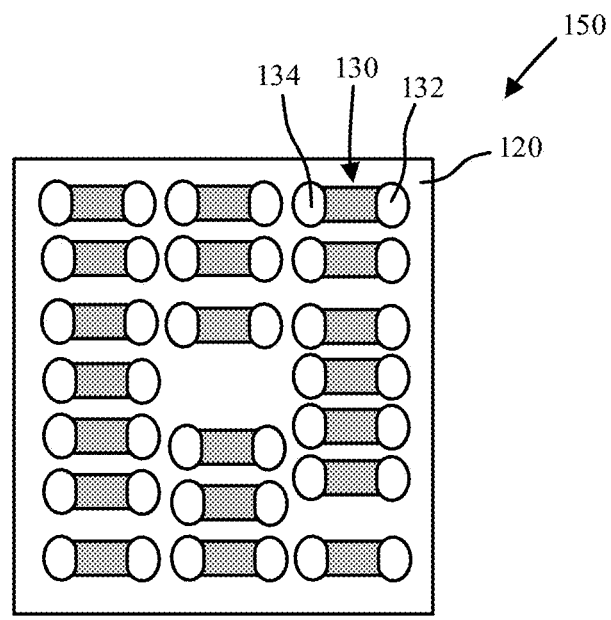
FIG. 7 is a schematic bottom view illustration of a plurality of passive components bonded to a die within a WLPA package in accordance with an embodiment.
Figure 8:
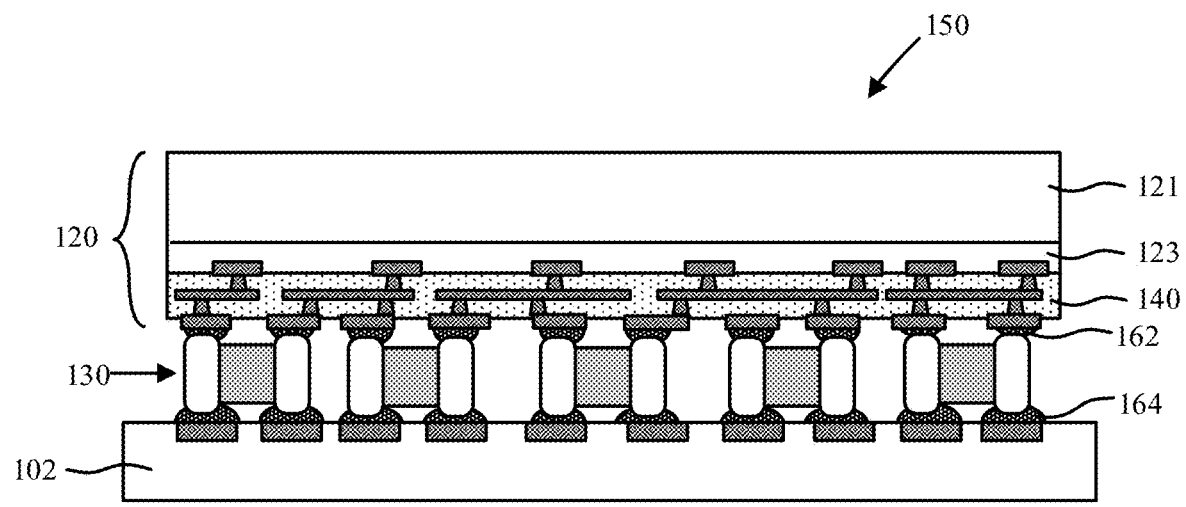
FIG. 8 is a schematic cross-sectional side view illustration of a plurality of passive components of a WLPA package mounted on a circuit board in accordance with an embodiment.

FIG. 7 is a schematic bottom view illustration of a plurality of passive components 130 bonded to a die 120 within a WLPA package 150 in accordance with an embodiment. FIG. 8 is a schematic cross-sectional side view illustration of a plurality of passive components 130 of a WLPA package 150 mounted on a circuit board 102 in accordance with an embodiment. As shown, the plurality of passive components 130 can substantially populate the bottom side of the package 150 area, with all electrical connections to the circuit board 102 being made through the terminals 132, 134 of the passive components 130. While not separately illustrated, dummy passive components 130X can also be distributed among the passive components 130.

Figure 9:
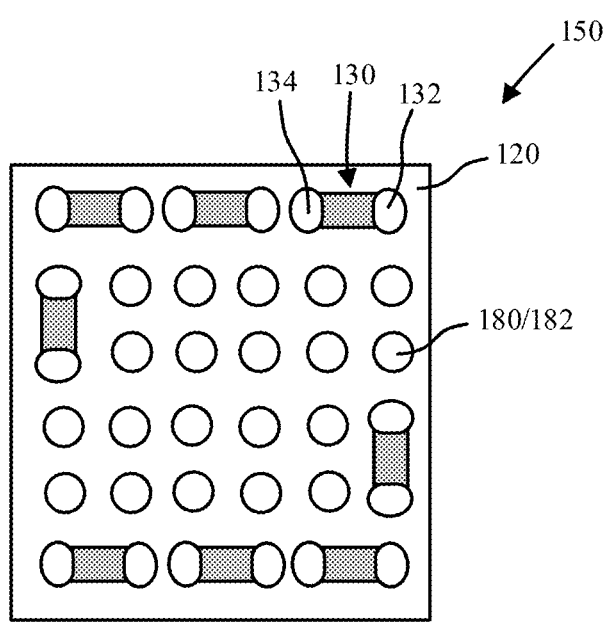
FIG. 9 is a schematic bottom view illustration of a plurality of passive components and laterally adjacent vertical interconnects bonded to a die within a WLPA package in accordance with an embodiment.
Figure 10A:
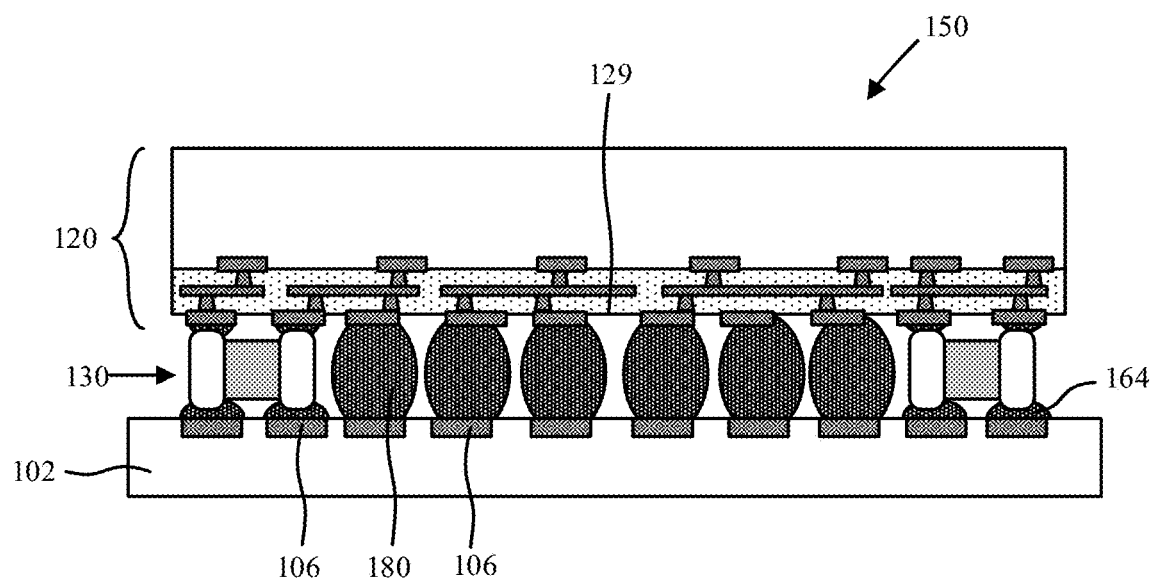
FIG. 10A is a schematic cross-sectional side view illustration of a plurality of passive components and laterally adjacent solder bumps of a WLPA package mounted on a circuit board in accordance with an embodiment.

In some embodiments, additional vertical interconnects can be provided laterally adjacent to the plurality of passive components 130 to provide electrical connection between the circuit board 102 and die 120. FIG. 9 is a schematic bottom view illustration of a plurality of passive components 130 and laterally adjacent vertical interconnects bonded to a die within a WLPA package in accordance with an embodiment. For example, in the embodiment illustrated in FIG. 10A a plurality of solder bumps 180 (which can be cored, or not cored) are bonded to both the bottom side 129 of the die 120 and a second plurality of landing pads 106 of the circuit board 102. In the embodiment illustrated in FIG. 10B a plurality of conductive pillars 182 (e.g. copper plated) extend from the bottom side 129 of the die 120 and are bonded to a second plurality of landing pads 106 of the circuit board 102. Such an arrangement may be used to provide a higher density of conductive pillars 182 than density available with the passive component terminals 132, 134. Solder tips 184 may optionally be formed on the bottom sides of conductive pillars 182 to facilitate bonding to the circuit board 102. Alternative interconnects can also be used, such as printed circuit board (PCB) bars. For example, conductive pillars 182 can be located within PCB bars.

Figure 10B:
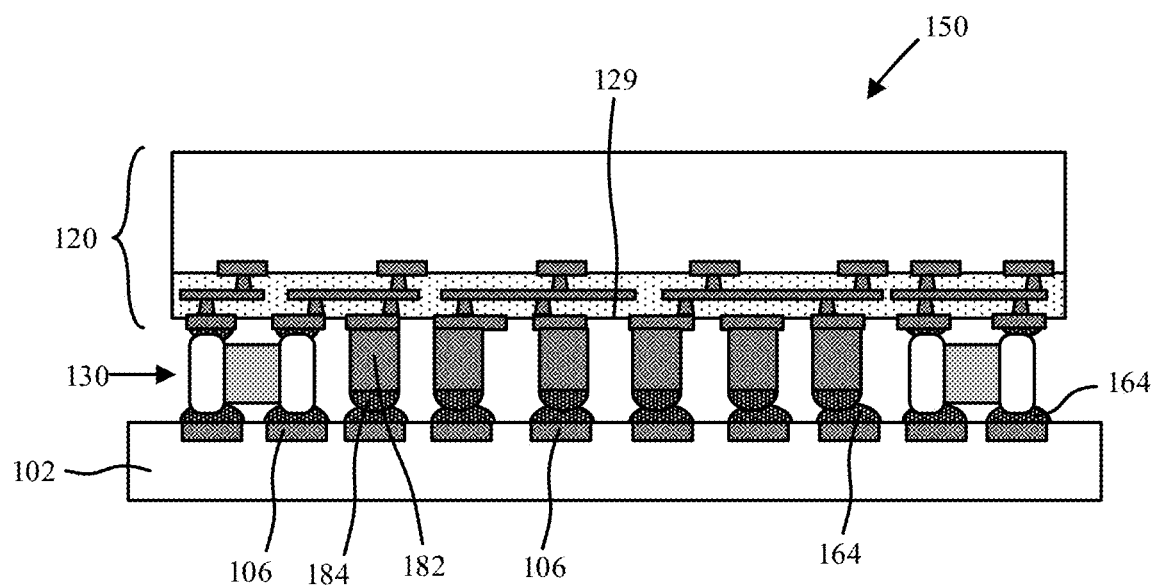
FIG. 10B is a schematic cross-sectional side view illustration of a plurality of passive components and laterally adjacent conductive pillars of a WLPA package mounted on a circuit board in accordance with an embodiment.

In each configuration of FIGS. 9-10B the passive components 130 and additional electrical connections are illustrated as being bonded to the bottom side of the die 120, and directly underneath the die 120. It is to be appreciated that embodiments are not necessarily so limited, and are also compatible with configuration of FIG. 5 and fanout RDL 140 where all passive components are not necessarily directly underneath the die 120.

Figure 11:
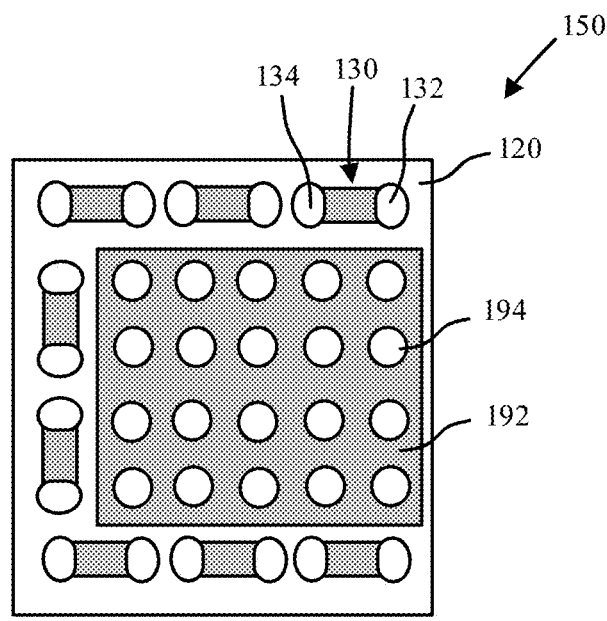
FIG. 11 is a schematic bottom view illustration of a plurality of passive components and laterally adjacent interposer bonded to a die within a WLPA package in accordance with an embodiment.

FIG. 11 is a schematic bottom view illustration of a plurality of passive components 130 and laterally adjacent an interposer 192 bonded to a die 120 within a WLPA package 150 in accordance with an embodiment. For example, in the embodiment illustrated in FIG. 12 a plurality of passive components 130 and laterally adjacent interposer 192 are bonded to both the bottom side 129 of the die 120 and a second plurality of landing pads 106 of the circuit board 102. The interposer 192 may include a plurality of vertical interconnects 194 (e.g. pillars, vias, etc.) connecting the landing pads 106 of the circuit board 102 and contact pads 142 of the die 120. The vertical interconnects 194 may be embedded in an insulating material, which may be one or more layers, such as polymer, PCB substrate (e.g. glass-reinforced epoxy laminate), etc.

Figure 12:
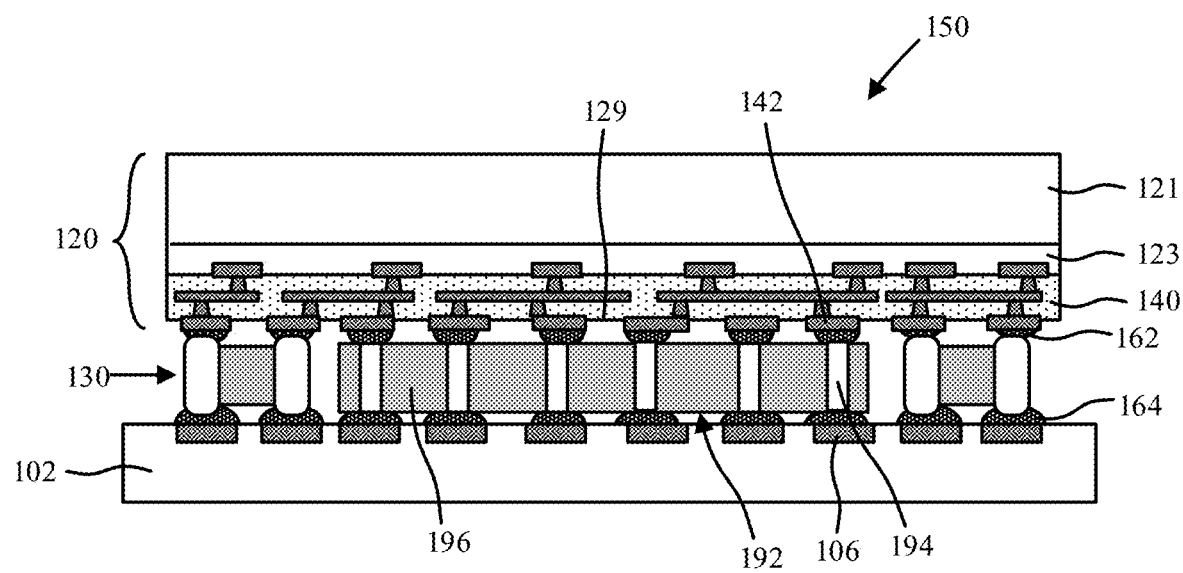
FIG. 12 is a schematic cross-sectional side view illustration of a plurality of passive components and laterally adjacent interposer of a WLPA package mounted on a circuit board in accordance with an embodiment.

In each configuration of FIGS. 11-12 the passive components 130 and additional electrical connections are illustrated as being bonded to the bottom side of the die 120, and directly underneath the die 120. It is to be appreciated that embodiments are not necessarily so limited, and are also compatible with configuration of FIG. 5 and fanout RDL 140 where all passive components are not necessarily directly underneath the die 120.

Up until this point embodiments have been described in which the passive components 130 within the package 150 are all the same height, which can facilitate mounting onto the circuit board 102. In the embodiments illustrated in FIGS. 13-15 various configurations are described in which the packages 150 include passive components of different heights. In each configuration a first set of one or more passive components 130A and second set of one or more passive components 130B are illustrated as being bonded to the bottom side of the die 120, and directly underneath the die 120. It is to be appreciated that embodiments are not necessarily so limited, and are also compatible with configuration of FIG. 5 and fanout RDL 140 where all passive components are not necessarily directly underneath the die 120. Furthermore, while pluralities of components are described and illustrated, the concepts are also applicable to sets of one or more components of different heights.

Figure 13:
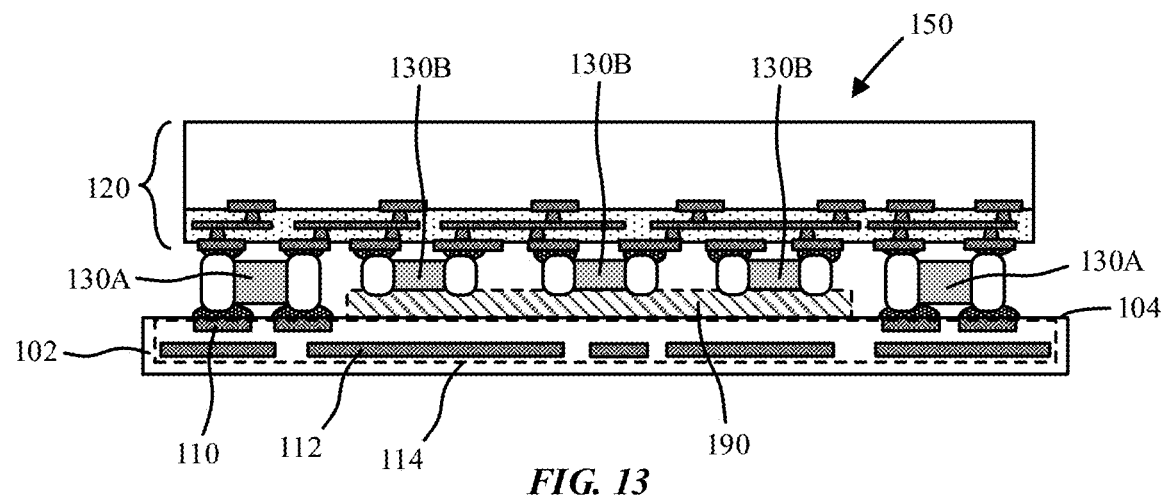
FIGS. 13-15 are schematic cross-sectional side view illustrations of WLPA packages including passive components of different heights mounted on circuit boards in accordance with embodiments.

Referring now to FIG. 13, in an embodiment, the first set of one or more passive components 130A is taller than the second set of one or more passive components 130B. As illustrated the second set of passive components 130B may have die only connections. A bottom side of the second set of passive components may optionally be embedded within an adhesive layer 190 (e.g. non-electrically conductive) on a top side 104 of the circuit board 102. The adhesive layer 190 may provide adhesion of the package 150 to the circuit board 102, reduce vibration, and mitigate a difference in height between the taller passive components 130A. In some embodiments, the adhesive layer 190 may include heat channeling functionality. For example, such heat channeling functionality may be used to transfer heat from an interior portion to lateral edges of the package 150 to help dissipate heat. In some embodiments, an addition, distinct layer may be provided laterally above or below adhesive layer 190 to provide heat channeling functionality as described above. In an embodiment, the adhesive layer spans along the top side 104 of the circuit board 102 beyond a lateral edge of the package 150.

Figure 14:
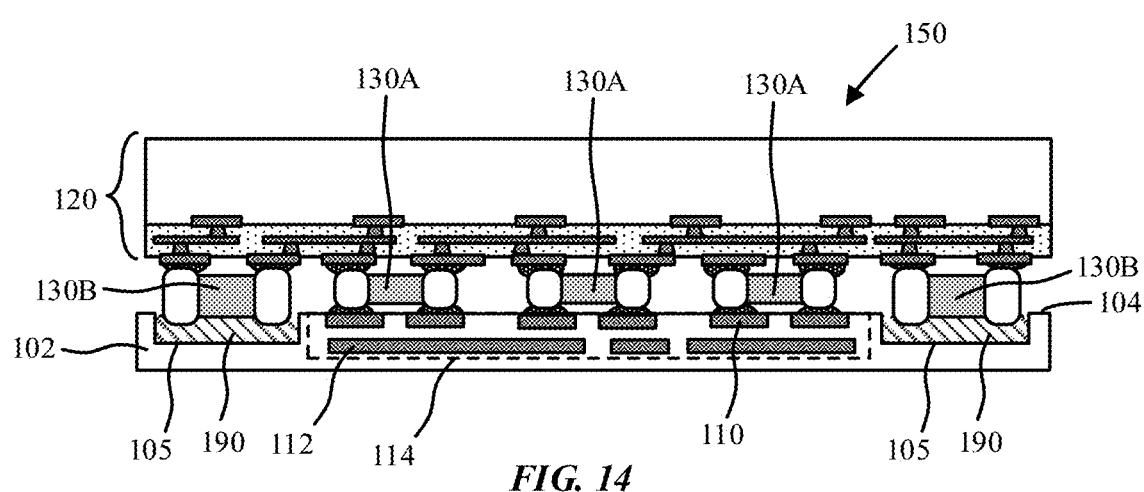

The embodiment illustrated in FIG. 14 includes a similar arrangement of passive components as that provided in FIG. 13 with different electrical connections. In the illustrated embodiment, the second set of passive components 130B is now taller than the first set of passive components 130A, and the second set of passive components 130B extends into one or more trenches 105 formed in the top side 104 of the circuit board 102. Similarly, the bottom sides of the second set of passive components 130B can be embedded in an adhesive layer 190 within the one or more trenches. Adhesive layer 190 may be patterned, and perform the same functions as previously described. Referring to both FIGS. 13-14, the circuit board 102 may include electrical routing layers 112 distributed within an electrical routing area 114. As shown, in FIG. 13, the electrical routing area 114 may be across the entire circuit board 102 area. In the embodiment illustrated in FIG. 14, the trenches can be formed through one or more layers of circuit board 102 reserved for electrical routing. Thus, one or more electrical routing layers may be excluded from areas directly underneath the one or more trenches 105. In this manner, partial electrical routing layers 112 may be provided up to a certain metal layer directly under the one or more trenches 105, or the electrical routing layers 112 may be excluded from areas directly underneath the one or more trenches 105.

Figure 15:
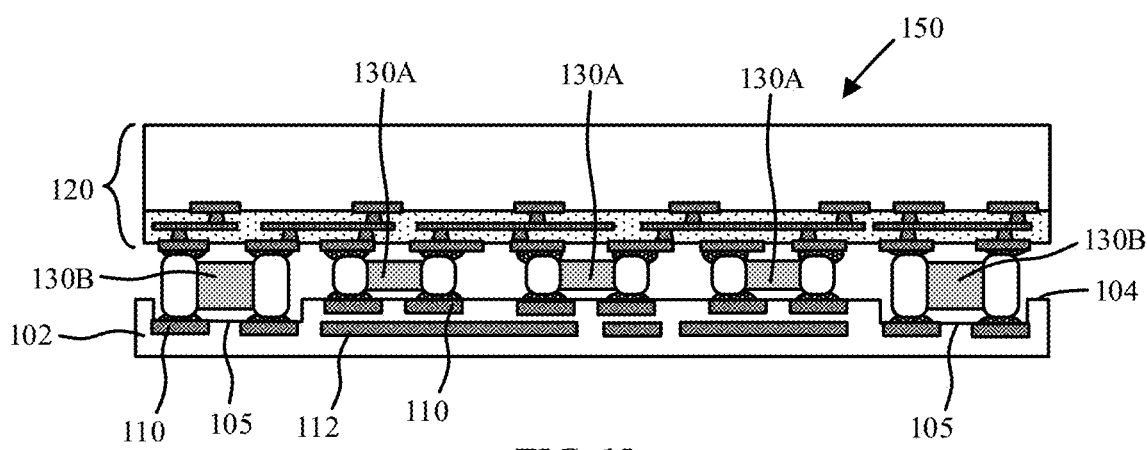

The embodiment of FIG. 15 additionally includes a similar arrangement of passive components as that provided in FIG. 14, with the set of passive components 130A bonded to landing pads 110 on a top side 104 of the circuit board 102, and the second set of passive components 130B bonded to landing pads within trenches 105 formed in the top side 104 of the circuit board 102. The routing area 114 may extend across the entire circuit board 102 area, including underneath the trenches 105. In some embodiments, the first set of one or more passive components 130A may all be positioned on one lateral end of package 150, as viewed from a top-down or cross-sectional perspective. In such embodiments, second set of one or more passive components 130B may be positioned at an opposing lateral end of package 150, as similarly viewed from a top-down or cross-sectional perspective.

Figure 16:
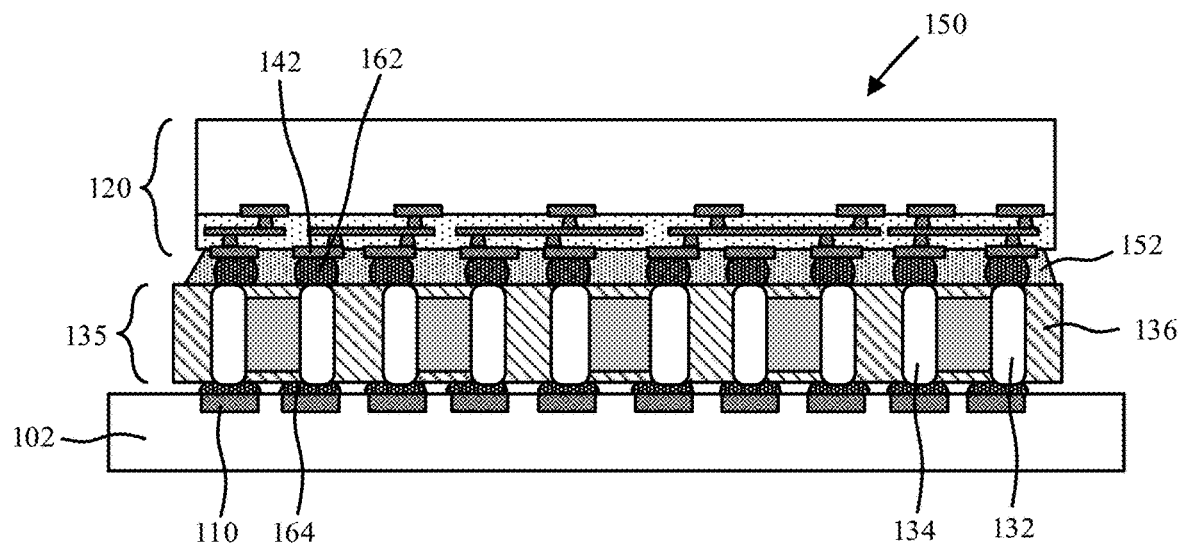
FIGS. 16-17 are schematic cross-sectional side view illustrations of WLPA packages including a package level with embedded passive components in accordance with embodiments.
Figure 17:
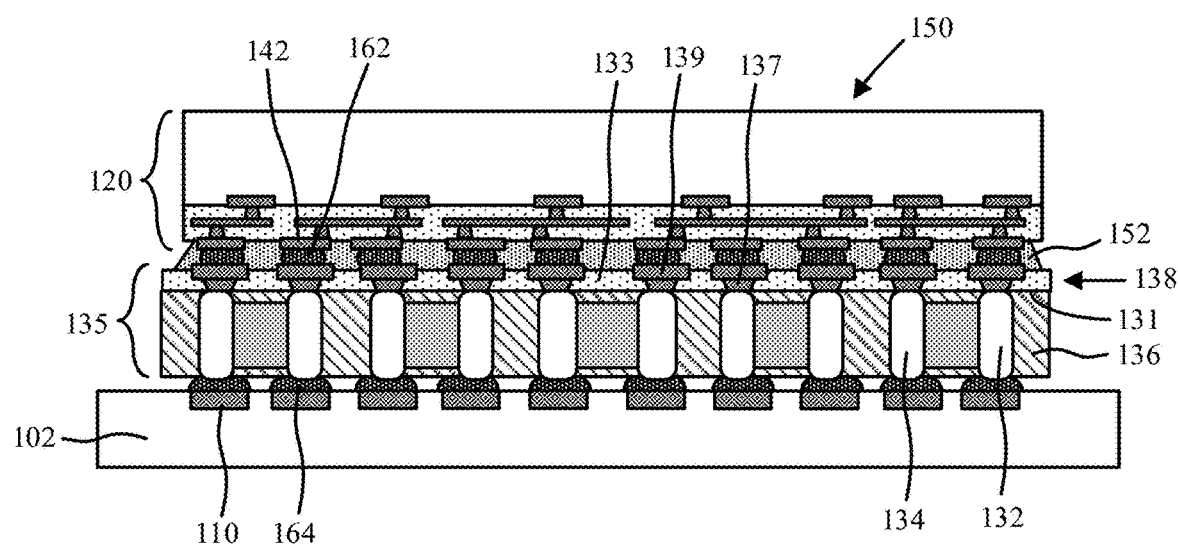

Referring now to FIGS. 16-17 schematic cross-sectional side view illustrations are provided of WLPA packages 150 including a package level 135 with embedded passive components 130 in accordance with embodiments. In particular, the package level 135 may be similar to an interposer that is separately fabricated and bonded with the die 120. Thus, the interposer-type package level 135 is not die 120 size limited, can be fabricated separately from the die 120, and embeds the passive components 130 within an insulating layer 136 (e.g. molding compound) which provides additional mechanical protection. The particular embodiment illustrated in FIG. 16 is a substrate-less package level 135 in which the terminals 132, 134 of the passive components 130 are exposed on both top and bottom sides of the package level 135. The embodiment illustrated in FIG. 17 adds a second RDL 138 on a top side 131 of the plurality of passive components 130 and the insulating layer 136. As shown, the die 120 can be bonded to the second RDL 138 with a plurality of solder joints 162. Second RDL 138 may include one or more routing layers 137, dielectric layers 133, and contact pads 139 similar to those previously described with RDL 140.

Figure 18:
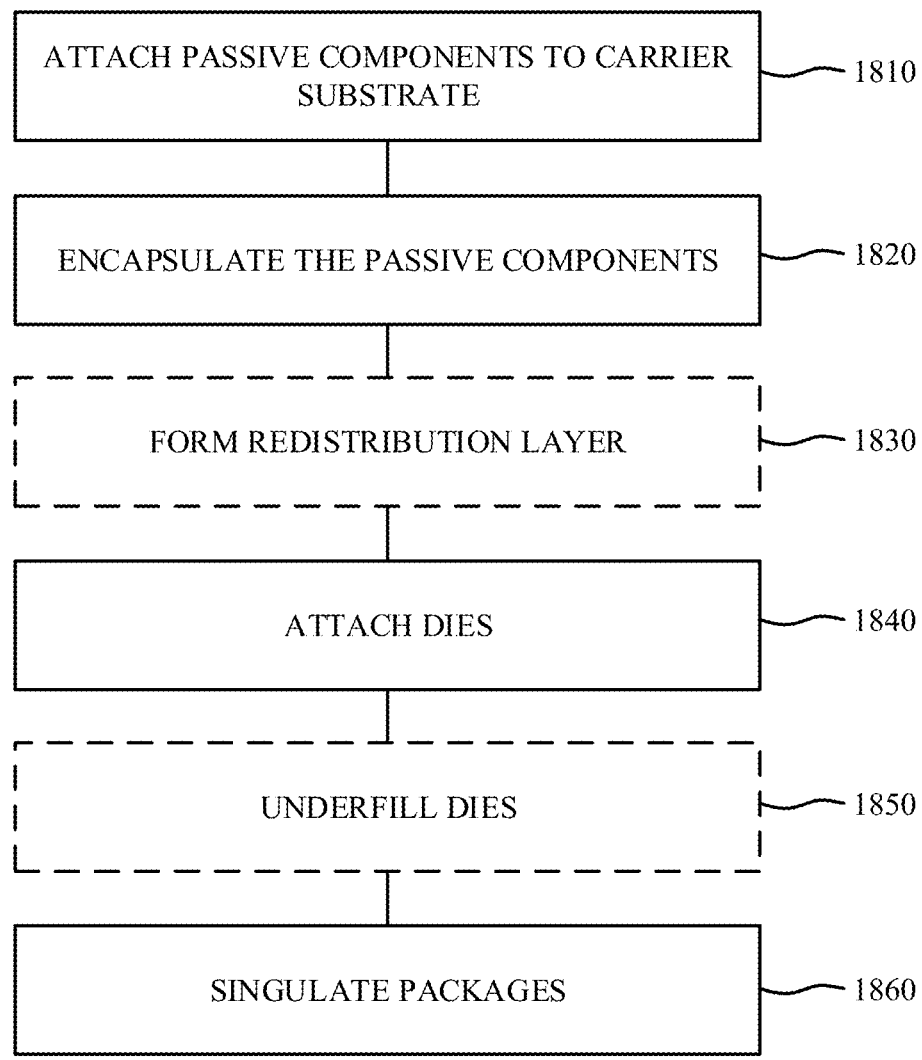
FIG. 18 is a process flow for a method of fabricating a WLPA package with embedded passive components in accordance with an embodiment.

FIG. 18 is a process flow for a method of fabricating a WLPA package 150 such as those illustrated in FIGS. 16-17 in accordance with embodiments. At operation 1810 the plurality of passive components 130 may be attached to a carrier substrate, and then encapsulated with an insulating layer 136 at operation 1820. To form the interposer-type package level 135 of FIG. 16 the top surfaces of the passive component 130 terminals 132, 134 are exposed and provided with a surface finishing material. To form the interposer-type package level 135 of FIG. 17 the top surfaces of the passive component 130 terminals 132, 134 are exposed, and RDL 138 is formed thereon at operation 1830. A plurality of dies 120 can then be attached at operation 1840, for example using flip chip technique, followed by optional underfilling at operation 1850, and singulation of the packages 150 at operation 1860.

In utilizing the various aspects of the embodiments, it would become apparent to one skilled in the art that combinations or variations of the above embodiments are possible for forming modules and WLPA packages. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A module comprising:
    a circuit board including a top side including a first plurality of landing pads; and
    a package mounted on the circuit board and bonded to the first plurality of landing pads, the package including:
        a die;
        a plurality of passive components bonded to a bottom side of the die and the first plurality of landing pads of the circuit board;
        wherein the plurality of passive components is directly underneath the die; and
        an interposer bonded to the bottom side of the die and bonded to a second plurality of landing pads of the circuit board, wherein the interposer is laterally adjacent to the plurality of passive components;
        wherein the plurality of passive components is bonded to the die with a first solder material and bonded to the circuit board with a second solder material, wherein the first solder material is characterized by a higher reflow temperature than the second solder material.

2. The module of claim 1, wherein the die includes a redistribution layer (RDL) formed on a back-end-of-the-line (BEOL) build-up structure.

3. The module of claim 1, wherein each passive component of the plurality of passive components includes two terminals, each terminal respectively coupled to both the die and the circuit board.

4. The module of claim 1:
    wherein the die is encapsulated in a molding compound, and further comprising a redistribution layer (RDL) formed on the molding compound and a back-end-of-the-line (BEOL) build-up structure of the die; and
    wherein the plurality of passive components is bonded to the RDL.

5. The module of claim 2, wherein the RDL is formed on and in electrical connection with a plurality of BEOL pads of the BEOL build-up structure, and the plurality of passive components is bonded to a plurality of contact pads of the RDL.

6. The module of claim 2, wherein the RDL covers a plurality of test pads of the BEOL build-up structure, wherein the plurality of test pads is electrically open.

7. The module of claim 3, further comprising a first circuit connecting the die and the circuit board, wherein a first passive component of the plurality of passive components is connected to the first circuit and configured to provide a vertical shunt interconnect between the die and the circuit board through a first terminal of the first passive component.

8. The module of claim 3, further comprising a first circuit connecting the die and the circuit board, wherein a first passive component of the plurality of passive components is connected to the first circuit as a capacitor.

9. The module of claim 3, further comprising a first circuit connecting the die and the circuit board, wherein a circuit path of the first circuit passes from the die to a first terminal of a first passive component of the plurality of passive components, through the first passive component to a second terminal of the first passive component, and from the second terminal to the circuit board.

10. The module of claim 3, further comprising:
    a first circuit connecting the die and the circuit board, wherein a first passive component of the plurality of passive components is connected to the first circuit and configured to provide a vertical shunt interconnect between the die and the circuit board through a first terminal of the first passive component: and
    a second circuit comprising:
        a second circuit path that passes from the die to a first terminal of a second passive component of the plurality of passive components, through the second passive component to a second terminal of the second passive component, and from the second terminal to the die;
        a second circuit path that passes from the die to a first terminal of a second passive component of the plurality of passive components, through the second passive component to a second terminal of the second passive component, and from the second terminal to the circuit board; or
        a second circuit path that passes from the circuit board to a first terminal of a second passive component of the plurality of passive components, through the second passive component to a second terminal of the second passive component, and from the second terminal to the circuit board.

11. The module of claim 4, wherein a portion of the plurality of passive components extends beyond a perimeter of the die.

12. A module comprising:
a circuit board including a top side including a first plurality of landing pads;
a package mounted on the circuit board and bonded to the first plurality of landing pads, the package including:
a die;
a plurality of passive components bonded to a bottom side of the die and the first plurality of landing pads of the circuit board;
wherein the plurality of passive components is directly underneath the die; and
an interposer bonded to the bottom side of the die and bonded to a second plurality of landing pads of the circuit board, wherein the interposer is laterally adjacent to the plurality of passive components;
wherein each passive component of the plurality of passive components includes two terminals, each terminal respectively coupled to both the die and the circuit board; and
a first circuit connecting the die and the circuit board, wherein a circuit path of the first circuit passes from the die to a first terminal of a first passive component of the plurality of passive components, through the first passive component to a second terminal of the first passive component, and from the second terminal to the circuit board.

13. A module comprising:
a circuit board including a top side including a first plurality of landing pads;
a package mounted on the circuit board and bonded to the first plurality of landing pads, the package including:
a die;
a plurality of passive components bonded to a bottom side of the die and the first plurality of landing pads of the circuit board;
wherein the plurality of passive components is directly underneath the die; and
an interposer bonded to the bottom side of the die and bonded to a second plurality of landing pads of the circuit board, wherein the interposer is laterally adjacent to the plurality of passive components;
wherein each passive component of the plurality of passive components includes two terminals, each terminal respectively coupled to both the die and the circuit board;
a first circuit connecting the die and the circuit board, wherein a first passive component of the plurality of passive components is connected to the first circuit and configured to provide a vertical shunt interconnect between the die and the circuit board through a first terminal of the first passive component: and
a second circuit comprising:
a second circuit path that passes from the die to a first terminal of a second passive component of the plurality of passive components, through the second passive component to a second terminal of the second passive component, and from the second terminal to the die;
a second circuit path that passes from the die to a first terminal of a second passive component of the plurality of passive components, through the second passive component to a second terminal of the second passive component, and from the second terminal to the circuit board; or
a second circuit path that passes from the circuit board to a first terminal of a second passive component of the plurality of passive components, through the second passive component to a second terminal of the second passive component, and from the second terminal to the circuit board.

* * * * *